United States Patent
Rodriguez et al.

(10) Patent No.: US 11,719,569 B2
(45) Date of Patent: Aug. 8, 2023

(54) METHOD OF IDENTIFYING FAULT IN SYNCHRONOUS RELUCTANCE ELECTRIC MACHINE, MONITORING SYSTEM AND SYNCHRONOUS RELUCTANCE ELECTRIC MACHINE

(71) Applicant: ABB Schweiz AG, Baden (CH)

(72) Inventors: Pedro Rodriguez, Västerås (SE); Jahirul Islam, Västerås (SE); Reza Rajabi Moghaddam, Västerås (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/906,470

(22) PCT Filed: Feb. 8, 2021

(86) PCT No.: PCT/EP2021/052936
§ 371 (c)(1),
(2) Date: Sep. 15, 2022

(87) PCT Pub. No.: WO2021/185512
PCT Pub. Date: Sep. 23, 2021

(65) Prior Publication Data
US 2023/0117062 A1    Apr. 20, 2023

(30) Foreign Application Priority Data
Mar. 20, 2020   (EP) ..................................... 20164624

(51) Int. Cl.
*G01R 31/34*   (2020.01)
*G01H 1/00*    (2006.01)
*H02K 1/24*    (2006.01)

(52) U.S. Cl.
CPC ........... *G01H 1/003* (2013.01); *G01R 31/343* (2013.01); *H02K 1/246* (2013.01); *H02K 2213/03* (2013.01)

(58) Field of Classification Search
CPC ...... G01R 31/343; G01H 1/003; H02K 1/246; H02K 2213/03
See application file for complete search history.

(56) References Cited

U.S. PATENT DOCUMENTS 6,529,135 B1 * 3/2003 Bowers ............... H02P 23/0077
                                              340/648
9,255,837 B2 * 2/2016 Rodriguez ............. G01H 17/00
(Continued)

FOREIGN PATENT DOCUMENTS

CN       103608652 A    2/2014
EP         3220120 A1    9/2017
(Continued)

OTHER PUBLICATIONS

International Search Report and Written Opinion of the International Searching Authority; Application No. PCT/EP2021/052936; Completed: Sep. 20, 2022; 7 Pages.
(Continued)

*Primary Examiner* — Alesa Allgood
(74) *Attorney, Agent, or Firm* — Whitmyer IP Group LLC

(57) ABSTRACT

A method of identifying a fault in a synchronous reluctance electric machine, the method including carrying out a first vibration measurement on a stator in a first radial direction of the stator; carrying out a second vibration measurement on the stator in a second radial direction of the stator; determining, on the basis of at least one of the first vibration measurement and the second vibration measurement, a first vibration frequency; determining, on the basis of the first vibration measurement and the second vibration measurement, a mode shape of the vibration at the first vibration frequency; and determining, on the basis that the first vibration frequency $f_b$ and the mode shape m fulfil the following barrier fault conditions:

$$f_b = f_r, \text{ and } m = 1$$

where $f_r$ is a rotation frequency of a rotor, that a flux barrier of the rotor is defect.

17 Claims, 2 Drawing Sheets

(56) References Cited

U.S. PATENT DOCUMENTS

| | | | | |
|---|---|---|---|---|
| 9,823,308 B2 * | 11/2017 | Rodriguez | ............. | G01H 1/003 |
| 2014/0109679 A1 * | 4/2014 | Rodriguez | ............. | G01H 17/00 |
| | | | | 73/660 |
| 2018/0321321 A1 | 11/2018 | Rodriguez et al. | | |

FOREIGN PATENT DOCUMENTS

| | | |
|---|---|---|
| FR | 3044410 A1 | 6/2017 |
| WO | 2016127136 A1 | 8/2016 |

OTHER PUBLICATIONS

Tamiya, et al.; "Failure Phenomenon and Fatigue Design Method of Synchronous Reluctance Motor Rotor by Rotating Failure Test"; Journal of the Society of Materials Science, vol. 57, No. 8; Aug. 2008; 6 Pages.

Bianchi, Nicola; et al.; "Rotor Flux-Barrier Design for Torque Ripple Reduction in Synchronous Reluctance and PM-Assisted Synchronous Reluctance Motors"; IEEE Transactions on Industry Applications, vol. 45, No. 3; IEEE; May 19, 2009; 8 Pages.

Kolehmainen, Jere, et al.; "Synchronous Reluctance Motor With Form Blocked Rotor"; IEEE Transactions on Energy Conversion, vol. 25, No. 2, IEEE Service Center; Piscataway, NJ; Jun. 1, 2010; 7 Pages.

Battal, et al.; "A Comparative Vibration Analysis of Induction and Synchronous Reluctance Motor"; Journals and Books, vol. 171; Science Direct, Nov. 2018; 6 Pages.

ABB; "Condition monitoring solutions for motors and generators: Enabling the right maintenance at the right time"; Motors and Generators; Retrieved on Sep. 15, 2022; 12 Pages.

Extended European Search Report; Application No. 20164624.7; Completed: Sep. 23, 2020; dated Oct. 10, 2020; 10 Pages.

International Search Report and Written Opinion of the International Searching Authority; Application No. PCT/EP2021/052936; Completed: May 10, 2021; dated May 19, 2021; 15 Pages.

Chinese Office Action; Application No. 2021800205495; dated Mar. 21, 2023; 14 Pages.

* cited by examiner

METHOD OF IDENTIFYING FAULT IN SYNCHRONOUS RELUCTANCE ELECTRIC MACHINE, MONITORING SYSTEM AND SYNCHRONOUS RELUCTANCE ELECTRIC MACHINE

TECHNICAL FIELD

The present disclosure generally relates to a synchronous reluctance electric machine. In particular, a method of identifying a fault in a synchronous reluctance electric machine, a monitoring system for identifying a fault in a synchronous reluctance electric machine, and a synchronous reluctance electric machine comprising a monitoring system, are provided.

BACKGROUND

A synchronous reluctance electric machine (SynRM) is a cost-efficient and sustainable alternative to rare-earth permanent magnet machines. Further advantages associated with synchronous reluctance electric machines are simple use and maintenance, better partial load efficiency compared to induction motors, and accurate control, e.g. with direct torque control (DTC), even without encoder. The rotor of a synchronous reluctance electric machine has a simple structure and may only comprise iron.

Like any technical device, synchronous reluctance electric machines may suffer from different kind of faults, either of mechanical or electrical character. Since synchronous reluctance electric machines have a moving element in the form of a rotor, many of the most common fault conditions cause vibrations to the machine. It is known that different fault conditions cause different kinds of vibrations. In turn, it follows that by knowing what kind of vibration a certain fault condition causes, it is possible to detect the fault by monitoring the vibration characteristics of the machine.

US 2014109679 A1 discloses a method for identifying a fault in an electrical machine. Vibration is measured in a plurality of radial directions of the stator. On the basis of the vibration measurements a vibration frequency and a mode shape of the vibration at this frequency is determined. Characteristics of the vibration in terms of both the vibration frequency and the mode shape are used to identify a fault condition of the electrical machine.

Reference 1 discloses a synchronous reluctance rotor structure for medium speed synchronous reluctance machines. In the rotor structure, referred to as a dovetail design, outer parts of the rotor are supported by inner parts using epoxy adhesive between the parts. The dovetail design is compared to a conventional "bridge-fixed" design where flux paths are fixed to the rest of the rotor structure with thin iron bridges. Tests of the two designs were performed using a vibration sensor. The dovetail design is concluded to increase in mechanical stability over the conventional bridge-fixed design.

Reference 1: JERE KOLEHMAINEN: "Synchronous Reluctance Motor With Form Blocked Rotor", IEEE TRANSACTIONS ON ENERGY CONVERSION, IEEE SERVICE CENTER, PISCATAWAY, N.J., U.S., vol. 25, no. 2, 1 Jun. 2010 (2010-06-01), pages 450-456, XPo11301030, ISSN: 0885-8969.

SUMMARY

In a synchronous reluctance electric machine having a rotor comprising a stack of core elements with flux barriers, the core elements may be mechanically weak in radially outer regions. In addition, these radially outer regions may be subjected to very high centrifugal forces and thermal stresses during operation of the machine. Thus, the core elements are prompt to break in the flux barriers and/or in structures adjacent to the flux barriers. In case such breakage is not detected, there is a risk of catastrophic failure of the entire machine and of a system driven by the machine.

One object of the present disclosure is to provide a method of identifying a fault in a synchronous reluctance electric machine, which method enables an early, simple, reliable and/or cost-effective detection of the fault.

A further object of the present disclosure is to provide a method of identifying a fault in a synchronous reluctance electric machine, which method enables an early, simple, reliable and/or cost-effective detection of a defect in a flux barrier of a core element.

A still further object of the present disclosure is to provide a method of identifying a fault in a synchronous reluctance electric machine, which method solves several or all of the foregoing objects in combination.

A still further object of the present disclosure is to provide a monitoring system for identifying a fault in a synchronous reluctance electric machine, which monitoring system solves one, several or all of the foregoing objects.

A still further object of the present disclosure is to provide a synchronous reluctance electric machine solving one, several or all of the foregoing objects.

According to one aspect, there is provided a method of identifying a fault in a synchronous reluctance electric machine comprising a stator and a rotor, the rotor comprising a plurality of magnetically conductive core elements stacked in an axial direction of the rotor, and each core element comprises flux barriers, the method comprising carrying out a first vibration measurement on the stator in a first radial direction of the stator; carrying out a second vibration measurement on the stator in a second radial direction of the stator; determining, on the basis of at least one of the first vibration measurement and the second vibration measurement, a first vibration frequency; determining, on the basis of the first vibration measurement and the second vibration measurement, a mode shape of the vibration at the first vibration frequency; and determining, on the basis that the first vibration frequency $f_b$ and the mode shape m fulfil the following barrier fault conditions:

$$f_b = f_r, \text{ and } m = 1$$

where $f_r$ is a rotation frequency of the rotor, that a flux barrier of the rotor is defect.

By means of the method, a failure of the rotor in the synchronous reluctance electric machine can be detected by vibration monitoring. The method enables an early detection of a defect of a flux barrier. Upon determining a defect in the flux barrier, an alarm may be issued to call for action and/or the machine may be automatically stopped. A consequential additional failure of the machine, and a potentially consequential failure of a driven system, can thereby be avoided.

The determination on the basis that the first vibration frequency and the mode shape fulfil the barrier fault conditions may alternatively be defined as lo determining, on the basis that the first vibration frequency matches a rotation frequency of the rotor and that the mode shape is mode number one. The method is thus based on the finding that a flux barrier breakage causes a certain combination of a vibration frequency and a mode shape of the vibrations of the rotor.

The vibrations of the rotor are in turn transmitted to the stator. The method may thus be "non-invasive". For example, the first and second vibration measurements may be performed by means of sensors arranged to measure vibrations of the stator in a first and second radial direction, respectively, such as accelerometers.

The rotor may comprise a plurality of rotor poles. Each rotor pole may comprise a plurality of flux barriers. Each core element may be a plate. The method may be performed with any type of synchronous reluctance electric machine according to the present disclosure.

The method may further comprise determining, on the basis that the first vibration frequency fb fulfils the following barrier fault condition:

$$f_b = \frac{f_s}{2p}$$

where $f_s$ is a supply frequency and p is a number of stator pole pairs, that a flux barrier of the rotor is defect.

The method may further comprise carrying out a plurality of vibration measurements in at least three different radial direction of the stator, such as at least four, at least six or at least eight different radial directions of the stator; determining, on the basis of at least one of the plurality of vibration measurements, a first vibration frequency; and determining, on the basis of the plurality of vibration measurements, a mode shape of the vibration at the first vibration frequency. The more measurements there are at different radial directions of the stator, the better is the reliability of this detection.

The method may further comprise determining that a flux barrier of the rotor is defect when the first vibration frequency and the mode shape fulfil the barrier fault conditions and when a vibration amplitude at the first vibration frequency exceeds a predetermined threshold value. Very small amplitude vibration is not harmful for the machine, and a false fault condition diagnosis can be thereby avoided.

The determination whether the first vibration frequency and the mode shape fulfil the barrier fault conditions may be performed continuously or repeatedly during operation of the synchronous reluctance electric machine.

The method may be partly performed online. For example, the determination of the first vibration frequency, the determination of the mode shape and/or the determination that a flux barrier of the rotor is defect, may be performed online, for example in the cloud. Thus, the method may comprise a partially wireless monitoring of the machine to detect a defect in the flux barrier.

According to a further aspect, there is provided a monitoring system for identifying a fault in a synchronous reluctance electric machine comprising a stator and a rotor, the rotor comprising a plurality of magnetically conductive core elements stacked in an axial direction of the rotor, and each core element comprises flux barriers, the monitoring system comprising a first sensor arranged to measure vibrations of the stator in a first radial direction of the stator; a second sensor arranged to measure vibrations of the stator in a second radial direction of the stator; and a control system comprising at least one data processing device and at least one memory having a computer program stored thereon, the computer program comprising program code which, when executed by one or more of the at least one data processing device, causes one or more of the at least one data processing device to perform the steps of detecting, based on measurement signals from the first sensor and the second sensor, a first vibration frequency and a mode shape of the vibration at the first vibration frequency; and determining, on the basis that the first vibration frequency fb and the mode shape m fulfil the following barrier fault conditions:

$$f_b = f_r, \text{ and } m=1$$

where $f_r$ is a rotation frequency of the rotor, that a flux barrier of the rotor is defect. The control system receives the measurement signals from the first sensor and the second sensor.

The computer program may comprise program code which, when executed by one or more of the at least one data processing device, causes one or more of the at least one data processing device to perform the step of determining, on the basis that the first vibration frequency $f_b$ fulfils the following barrier fault condition:

$$f_b = \frac{f_s}{2p}$$

where $f_s$ is a supply frequency and p is a number of stator pole pairs, that a flux barrier of the rotor is defect.

The monitoring system may comprise a plurality of sensors arranged to measure vibration in at least three different radial directions of the stator, such as at least four, at least six or at least eight different radial directions of the stator, and the control system may be arranged to receive measurement signals from the plurality of sensors. A high number of measurements at different radial directions of the stator allows a mode number to be detected with good reliability.

The computer program may comprise program code which, when executed by one or more of the at least one data processing device, causes one or more of the at least one data processing device to perform the step of determining that a flux barrier of the rotor is defect when the first vibration frequency and the mode shape fulfil the barrier fault conditions and when a vibration amplitude at the first vibration frequency exceeds a predetermined threshold value.

The determination whether the first vibration frequency and the mode shape fulfil the barrier fault conditions may be performed continuously or repeatedly during operation of the synchronous reluctance electric machine.

The sensors may be arranged to communicate wirelessly with the control system. Alternatively, or in addition, the sensors may be accelerometers. Accelerometers are preferable vibration sensors because of their small size and low price.

According to a further aspect, there is provided a synchronous reluctance electric machine comprising a monitoring system according to the present disclosure. The synchronous reluctance electric machine may be of any type according to the present disclosure.

BRIEF DESCRIPTION OF THE DRAWINGS

Further details, advantages and aspects of the present disclosure will become apparent from the following embodiments taken in conjunction with the drawings, wherein.

DETAILED DESCRIPTION

Figure 1:
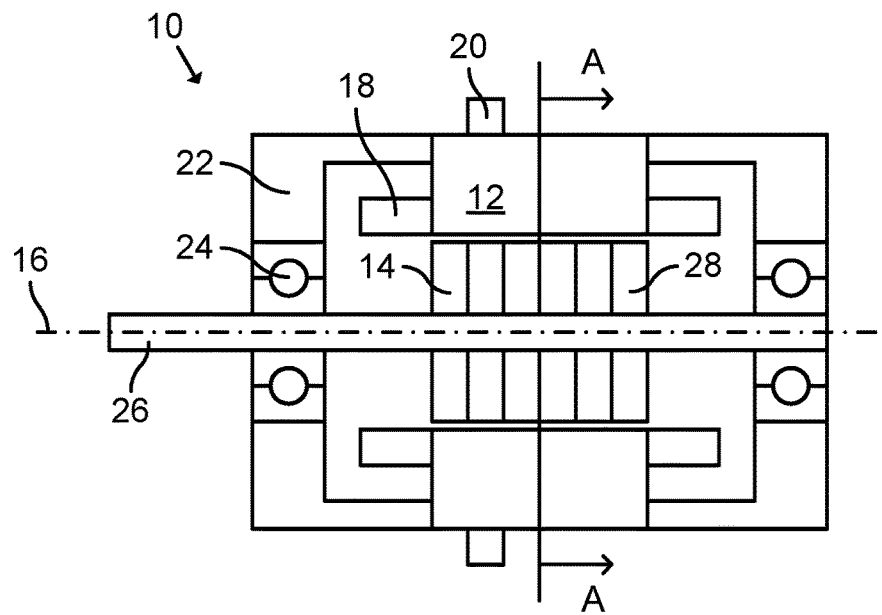
FIG. 1: schematically represents a cross-sectional side view of a synchronous reluctance electric machine.

In the following, a method of identifying a fault in a synchronous reluctance electric machine, a monitoring system for identifying a fault in a synchronous reluctance electric machine, and a synchronous reluctance electric machine comprising a monitoring system, will be described. The same or similar reference numerals will be used to denote the same or similar structural features.

FIG. 1 schematically represents a cross-sectional side view of a synchronous reluctance electric machine 10. The machine 10 comprises a stator 12 and a rotor 14. The rotor 14 is rotatable about a rotation axis 16. The rotation axis 16 defines an axial direction of the rotor 14. FIG. 1 further shows windings 18 of the stator 12 and sensors, here exemplified as accelerometers 20.

The machine 10 of this example comprises a frame 22 fixed to the stator 12. The machine 10 further comprises bearings 24 and a shaft 26 fixed to the rotor 14. The shaft 26 is rotatable about the rotation axis 16.

The rotor 14 comprises a plurality of magnetically conductive core elements 28. In this example, each core element 28 has an identic design. The core elements 28 are stacked in the axial direction of the rotor 14. Moreover, the core elements 28 are compressed together in the axial direction. In this example, each core element 28 is a thin plate, the thickness in FIG. 1 being strongly exaggerated for illustrative purposes. The core elements 28 are made of a magnetically conductive material, such as electric steel having a high value of relative permeability.

Figure 2:
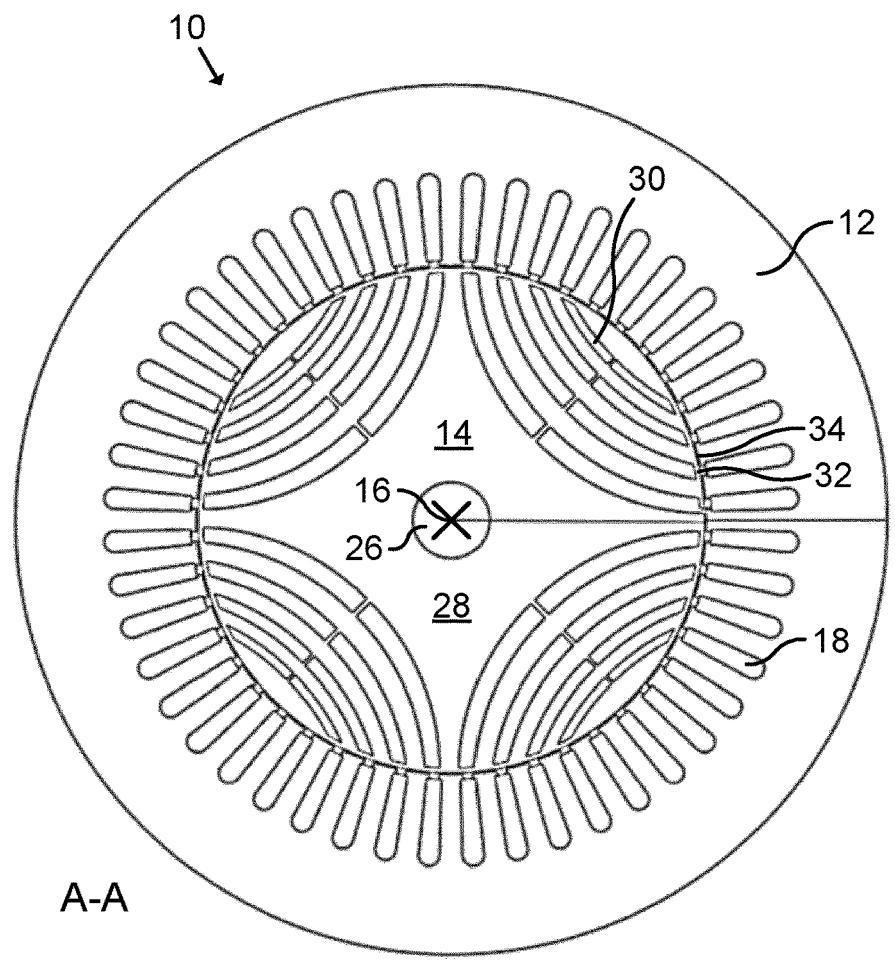
FIG. 2: schematically represents a cross-sectional front view of section A-A in FIG. 1.

FIG. 2 schematically represents a cross-sectional front view of section A-A in FIG. 1. As shown in FIG. 2, the core elements 28 are circular. Each core element 28 of the rotor 14 and therefore also the formed combination, i.e. rotor core, is operationally divided in sectorial sections. The number of sectorial sections defines the number of poles of the rotor 14. The rotor 14 of this example comprises four rotor poles, i.e. two rotor pole pairs. The stator 12 of this example comprises twelve stator poles, i.e. six stator pole pairs.

Each core element 28 comprises a plurality of magnetic flux barriers 30. As shown in FIG. 2, each rotor pole comprises four flux barriers 30, each flux barrier 30 being divided into two flux barrier sections separated by a narrow bridge in the middle. However, each rotor pole may comprise more or less than four flux barriers 30. Each flux barrier 30 may be an opening through the core element 28 (in the axial direction). The flux barriers 30 may be filled with air or with magnetically non-conductive material, such as aluminium, which has a lower relative permeability than the magnetically conductive material (such as electric steel) of the core elements 28.

FIG. 2 further shows that the core element 28 comprises tangential ribs 32. Each rib 32 is provided radially outside (with respect to the rotation axis 16) an end of a flux barrier 30. FIG. 2 further shows an air gap 34 between the rotor 14 and the stator 12.

In the context of the present disclosure, a breakage of a flux barrier 30 shall be construed to be equal with a breakage of a tangential rib 32.

Breakage of one flux barrier 30 of one core element 28 is typically associated with breakage of neighboring flux barriers 30 of adjacent core elements 28. When one of the flux barriers 30 breaks, the air gap 34 may be reduced. Thus, a broken flux barrier 30 risks to come into contact with the stator 12.

Figure 3:
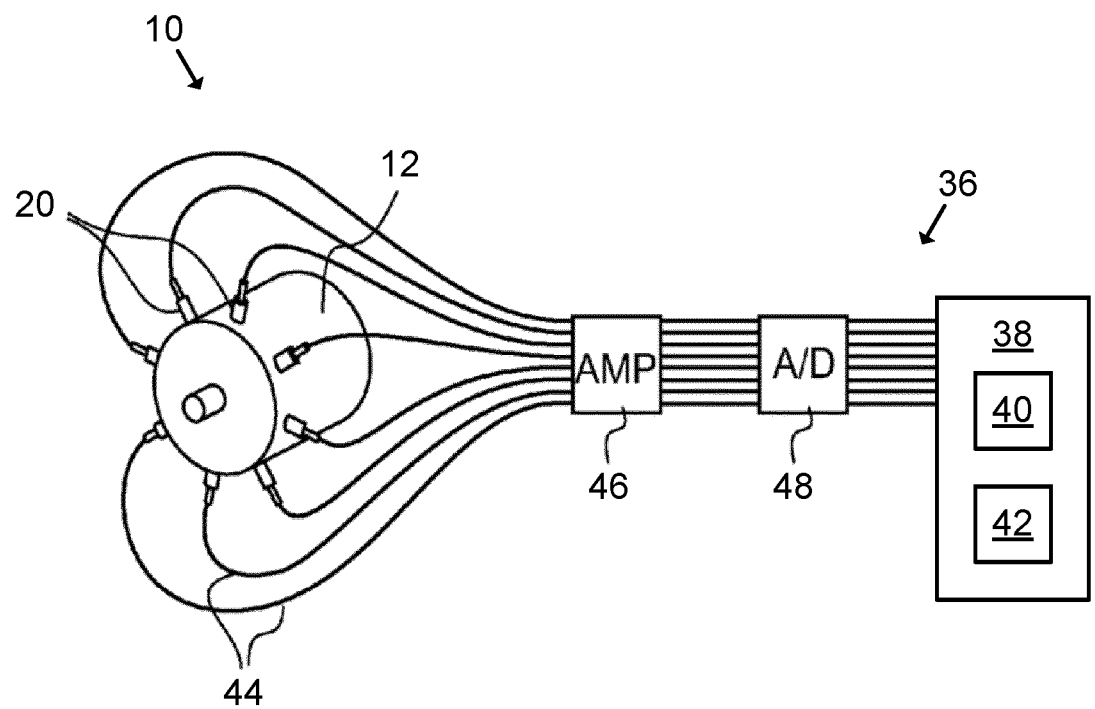
FIG. 3: schematically represents the synchronous reluctance electric machine comprising a monitoring system.

FIG. 3 schematically represents the synchronous reluctance electric machine 10 comprising a monitoring system 36. The monitoring system 36 is configured to identify a fault in the machine 10.

The monitoring system 36 comprises the accelerometers 20. The accelerometers 20 are configured to measure vibrations of the stator 12. As shown in FIG. 3, the monitoring system 36 of this example comprises eight accelerometers 20 evenly distributed around the circumference of the stator 12. A great number of accelerometers 20 enables an accurate determination of a mode shape of the vibration.

The monitoring system 36 further comprises a control system 38. The control system 38 comprises a data processing device 40 and a memory 42. The memory 42 has a computer program stored thereon. The computer program comprises program code which, when executed by the data processing device 40, causes the data processing device 40 to perform any step as described herein.

The monitoring system 36 of this example further comprises measurement cables 44, an amplifier 46 and an A/D converter 48. The accelerometers 20 are connected by the measurement cables 44 to the amplifier 46, and further to the A/D converter 48. The accelerometers 20 may alternatively be wireless, e.g. for online processing of vibration measurements from the accelerometers 20.

The accelerometers 20 provide vibration information in time space, i.e. the acceleration as a function of time. In addition, the angular position of each accelerometer 20 is known. The vibration measurements from the accelerometers 20 are stored in digital form in the memory 42 for further processing.

The data processing device 40 receives and processes the vibration measurements stored in the memory 42. To this end, the data processing device 40 may execute one or more computer programs stored in the memory 42. The computer program may comprise a two dimensions Fourier transform for determining a first vibration frequency and a mode shape. The computer program may further comprise program code for determining whether the first vibration frequency and the mode shape fulfil barrier fault conditions, as described herein.

Two dimensions Fourier transform, with respect to position (defined by the locations of the accelerometers 20) and with respect to time, is applied to the measurement results in order to reveal the mode shapes and the frequencies of the vibrations. The equation for the Fourier transform can be written as:

$$a(\theta, t) = \sum_{m=0}^{\infty}\sum_{n=0}^{\infty}[A_1 \cdot \cos(m \cdot \theta + n \cdot \omega \cdot t) + A_2 \cdot \cos(-m \cdot \theta + n \cdot \omega \cdot t)]$$

wherein a=measured acceleration, θ=angular position along a perimeter of the stator 12, t=time, A=calculated coefficients of the acceleration, ω=supply frequency, and wherein m determines the mode shape and n determines the vibration frequency.

During operation of the machine 10, radial vibrations are generated. By means of the accelerometers 20, the radial vibrations of the rotor 14 can be measured since the vibrations of the rotor 14 are transmitted to the stator 12.

Figure 4:
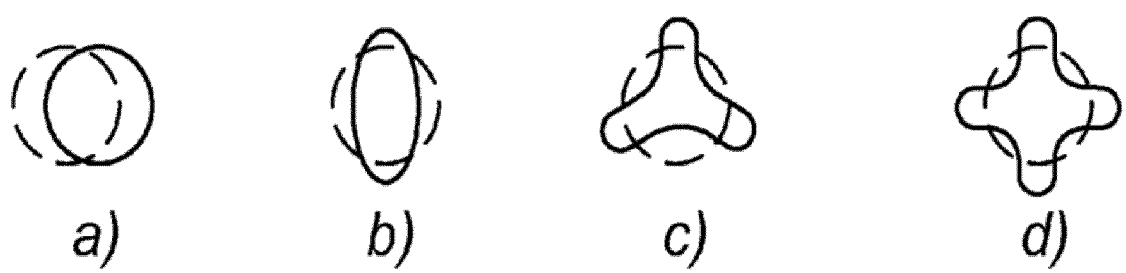
FIG. 4: shows the first four mode shapes of vibration.

In case one of the flux barriers 30 breaks, the rotor 14 becomes dynamically eccentric (with respect to the rotation axis 16). A vibration of the rotor 14 at the rotational frequency of the rotor 14 will thereby be excited. This vibration has vibration mode 1. By monitoring also the vibration mode, in addition to the vibration frequency, a fault of the rotor 14 can be distinguished from mechanical vibrations. The monitoring system 36 enables not only the detection of the vibration frequencies, but also the detection of the mode vibration shapes, the so-called mode shapes. FIG. 4 shows the first four mode shapes of vibration.

During operation of the machine 10, the monitoring system 36 continuously or repeatedly monitors vibrations, determines a first vibration frequency based on a first vibration measurement in a first radial direction and/or a second vibration measurement in a second radial direction, determines a mode shape of the vibration at the first vibration frequency based on the first and second vibration measurements, and determines whether the first vibration frequency and the mode shape fulfils barrier fault conditions. The barrier fault conditions are defined as:

$$f_b = f_r, \text{ and } m=1$$

where $f_b$ is the first vibration frequency, $f_r$ is the rotation frequency of the rotor 14, and m is the mode shape. If the barrier fault conditions are fulfilled, it is concluded that a flux barrier 30 is defect. Thus, by monitoring the vibration frequency and mode shape of the vibration of the rotor 14, a conclusive diagnostic can be given about the condition of the machine 10. Upon determining that a flux barrier 30 is defect, one or more preventive actions may be taken, such as automatic stopping of the machine 10.

While the present disclosure has been described with reference to exemplary embodiments, it will be appreciated that the present invention is not limited to what has been described above. For example, it will be appreciated that the dimensions of the parts may be varied as needed. Accordingly, it is intended that the present invention may be limited only by the scope of the claims appended hereto.

The invention claimed is:

1. A method of identifying a fault in a synchronous reluctance electric machine comprising a stator and a rotor, the rotor comprising a plurality of magnetically conductive core elements stacked in an axial direction of the rotor, and each core element includes flux barriers, the method comprising:
   carrying out a first vibration measurement on the stator in a first radial direction of the stator;
   carrying out a second vibration measurement on the stator in a second radial direction of the stator;
   determining, on the basis of at least one of the first vibration measurement and the second vibration measurement, a first vibration frequency;
   determining, on the basis of the first vibration measurement and the second vibration measurement, a mode shape of the vibration at the first vibration frequency;
   determining, on the basis that the first vibration frequency $f_b$ and the mode shape m fulfil the following barrier fault conditions:

$$f_b = f_r, \text{ and } m=1$$

where $f_r$ is a rotation frequency of the rotor that a flux barrier of the rotor is defect; and
   determining, on the basis that the first vibration frequency f.sub.b fulfils the following barrier fault condition: f.sub.b=f.sub.s/2p
   where f.sub.s is a supply frequency and p is a number of stator pole pairs, that a flux barrier of the rotor is defect.

2. The method according to claim 1, wherein the method comprises:
   carrying out a plurality of vibration measurements in at least three different radial directions of the stator,
   determining, on the basis of at least one of the plurality of vibration measurements, a first vibration frequency; and
   determining, on the basis of the plurality of vibration measurements, a mode shape of the vibration at the first vibration frequency.

3. The method according to claim 1, further comprising determining that a flux barrier of the rotor is defect when the first vibration frequency and the mode shape fulfil the barrier fault conditions and when a vibration amplitude at the first vibration frequency exceeds a predetermined threshold value.

4. The method according to claim 1, wherein the determination whether the first vibration frequency and the mode shape fulfil the barrier fault conditions is performed continuously or repeatedly during operation of the synchronous reluctance electric machine.

5. The method according to claim 1, wherein the method is partly performed online.

6. A monitoring system for identifying a fault in a synchronous reluctance electric machine comprising a stator and a rotor, the rotor comprising a plurality of magnetically conductive core elements stacked in an axial direction of the rotor, and each core element includes flux barriers, the monitoring system comprising:
   a first sensor arranged to measure vibrations of the stator in a first radial direction of the stator;
   a second sensor arranged to measure vibrations of the stator in a second radial direction of the stator; and
   a control system comprising at least one data processing device and at least one memory having a computer program stored thereon, the computer program including a program code which, when executed by one or more of the at least one data processing device, causes one or more of the at least one data processing device to perform the steps of:
   detecting, based on measurement signals from the first sensor and the second sensor, a first vibration frequency and a mode shape of the vibration at the first vibration frequency;
   determining, on the basis that the first vibration frequency $f_b$ and the mode shape m fulfil the following barrier fault conditions:

$$f_b = f_r, \text{ and } m=1$$

where $f_r$ is a rotation frequency of the rotors, that a flux barrier of the rotor is defect; and
   determining, on the basis that the first vibration frequency fb fulfils the following barrier fault condition: f.sub.b=f.sub.s/2p
   where f.sub.s is a supply frequency and p is a number of stator pole pairs, that a flux barrier of the rotor is defect.

7. The monitoring system according to claim 6 wherein the monitoring system comprises a plurality of sensors arranged to measure vibration in at least three different radial directions of the stator, and wherein the control system is arranged to receive measurement signals from the plurality of sensors.

8. The monitoring system according to claim 6, wherein the computer program comprises program code which, when executed by one or more of the at least one data processing device, causes one or more of the at least one data processing device to perform the step of:

determining that a flux barrier of the rotor is defect when the first vibration frequency and the mode shape fulfil the barrier fault conditions and when a vibration amplitude at the first vibration frequency exceeds a predetermined threshold value.

9. The monitoring system according to claim 6, wherein the determination whether the first vibration frequency and the mode shape fulfil the barrier fault conditions is performed continuously or repeatedly during operation of the synchronous reluctance electric machine.

10. The monitoring system according to claim 6, wherein the sensors are arranged to communicate wirelessly with the control system.

11. The monitoring system according to claim 6, wherein the sensors are accelerometers.

12. A synchronous reluctance electric machine comprising:
- a stator and a rotor, the rotor comprising a plurality of magnetically conductive core elements stacked in an axial direction of the rotor, and each core element includes flux barriers
- a monitoring system including;
- a first sensor arranged to measure vibrations of the stator in a first radial direction of the stator;
- a second sensor arranged to measure vibrations of the stator in a second radial direction of the stator; and
- a control system comprising at least one data processing device and at least one memory having a computer program stored thereon, the computer program inducting a program code which, when executed by one or more of the at least one data processing device, causes one or more of the at least one data processing device to perform the steps of:
- detecting, based on measurement signals from the first sensor and the second sensor, a first vibration frequency and a mode shape of the vibration at the first vibration frequency;
- determining, on the basis that the first vibration frequency $f_b$ and the mode shape m fulfil the following barrier fault conditions:

$f_b = f_r$, and m=1 where $f_r$ is a rotation frequency of the rotor, that a flux barrier of the rotor is defect; and
- determining, on the basis that the first vibration frequency fb fulfils the following barrier fault condition: f.sub.b=f.sub.s/2p
    where fs is a supply frequency and p is a number of stator pole pairs, that a flux barrier of the rotor is defect.

13. The synchronous reluctance electric machine according to claim 12, wherein the monitoring system comprises a plurality of sensors arranged to measure vibration in at least three different radial directions of the stator, and wherein the control system is arranged to receive measurement signals from the plurality of sensors.

14. The synchronous reluctance electric machine according to claim 12, wherein the computer program comprises program code which, when executed by one or more of the at least one data processing device, causes one or more of the at least one data processing device to perform the step of:
- determining that a flux barrier of the rotor is defect when the first vibration frequency and the mode shape fulfil the barrier fault conditions and when a vibration amplitude at the first vibration frequency exceeds a predetermined threshold value.

15. The synchronous reluctance electric machine according to claim 12, wherein the determination whether the first vibration frequency and the mode shape fulfil the barrier fault conditions is performed continuously or repeatedly during operation of the synchronous reluctance electric machine.

16. The synchronous reluctance electric machine according to claim 12, wherein the sensors are arranged to communicate wirelessly with the control system.

17. The synchronous reluctance electric machine according to claim 12, wherein the sensors are accelerometers.

* * * * *